United States Patent [19]

Butcher et al.

[11] Patent Number: 4,966,440
[45] Date of Patent: Oct. 30, 1990

[54] POST-EXPOSURE DYE TREATMENT IN THE PRODUCTION OF HOLOGRAMS

[75] Inventors: David W. Butcher, Goostrey; Stephen R. Post, Sale, both of England

[73] Assignee: Ilford Limited, Cheshire, United Kingdom

[21] Appl. No.: 327,114

[22] Filed: Mar. 22, 1989

[30] Foreign Application Priority Data

Mar. 24, 1988 [GB] United Kingdom ............... 8807027.1

[51] Int. Cl.$^5$ .......................... G03H 1/22; G03H 1/04
[52] U.S. Cl. .................................. 350/320; 350/3.61; 430/1; 430/2
[58] Field of Search ................... 350/3.61, 320; 430/1, 430/2

[56] References Cited

U.S. PATENT DOCUMENTS

| 3,932,025 | 1/1976 | Lakatos et al. | 350/388 |
|---|---|---|---|
| 3,963,490 | 6/1976 | Graube | 350/3.61 |
| 4,173,474 | 11/1979 | Tanaka et al. | 430/1 |
| 4,421,380 | 12/1983 | McGrew | 350/3.78 |
| 4,500,163 | 2/1985 | Burns et al. | 350/3.7 |
| 4,512,624 | 4/1985 | Nicholson | 350/3.69 |
| 4,530,564 | 7/1985 | Close | 350/3.69 |
| 4,548,463 | 10/1985 | Cato et al. | 350/3.71 |
| 4,602,843 | 7/1986 | Glaser-Inbari | 350/3.7 |
| 4,759,594 | 7/1988 | Bond et al. | 350/3.61 |
| 4,799,746 | 1/1989 | Wreede | 430/2 |

FOREIGN PATENT DOCUMENTS

85/01127  3/1985  PCT Int'l Appl. .

Primary Examiner—Bruce Y. Arnold
Assistant Examiner—Terry S. Callaghan
Attorney, Agent, or Firm—Wenderoth, Lind & Ponack

[57] ABSTRACT

A hologram which comprises a light transparent base having coated thereon a hydrophilic water-swellable layer which contains the holographic image and a dye whose peak absorption is below the peak replay wavelength of the hologram. The hologram is produced by adding the dye after exposure of the hologram.

2 Claims, No Drawings

POST-EXPOSURE DYE TREATMENT IN THE PRODUCTION OF HOLOGRAMS

BACKGROUND OF THE INVENTION

This invention relates to a new type of holograms and in particular to holograms in which the holographic image is present in a hydrophilic water-swellable layer.

Holograms wherein the holographic image is present in a hydrophilic water-swellable layer are in general of three main types. In the first of these the photosensitive agent used in the water-swellable layer is a metal dichromate. The binder is usually gelatin in this case and the holograms produced are referred to as dichromated gelatin holograms. Holograms produced using dichromated gelatin yield a very bright holographic image on replay but are very expensive to produce. In the second of these a photopolymerisation mixture is present in the hydrophilic water-swellable layer. After holographic exposure and aqueous processing a hologram is formed in the layer. However hologram produced using this material tend to exhibit low brightness and high haze.

The third type is wherein the photosensitive layer employed is a gelatino silver halide emulsion layer and now this is by far the most common material to employ in the production of holograms. However silver halide sensitised material especially when the hologram is a reflection hologram tends to lack brightness and also to exhibit haze. Thus when the hologram is to be displayed the holographic image is viewed against a black background and if haze or light-scatter is present the black background becomes degraded to a grey background.

SUMMARY OF THE INVENTION

It is the object of the present invention to provide a hologram which has improved brightness and reduced light scatter.

Therefore according to the present invention there is provided a hologram which comprises a light transparent base having coated thereon a hydrophilic water-swellable layer which contains the holographic image and a dye whose peak absorption is below the peak replay wavelength of the hologram.

DETAILED DESCRIPTION OF THE INVENTION

The hologram is usually a reflection hologram as the improvement is more marked with a reflection hologram rather than a transmission hologram. In fact if the transmission hologram is a display hologram the presence of the dye could reduce the brightness of the reconstructed hologram but if the transmission hologram is a holographic optical element (H.O.E.) the presence of the dye could be beneficial.

The hologram is most conveniently a silver halide sensitised material as the greatest improvement in brightness and decrease in scatter is observed with such material. Thus the hologram of the invention as hereinafter described relates particularly to a reflection hologram wherein the sensitive layer of the unexposed material is a gelatinous silver halide emulsion.

As a large number of reflection hologram for display purposes exhibit a yellow/goldish colour their peak replay wavelength is in the region of 560–600 nm. Thus a dye is required which has a λ max absorption preferably in the region of 440 to 540 nm.

Particularly suitable dyes which have a λ max absorption in this range are certain azine dyes and in particular Neutral Red whose λ max is 540 nm (CI50040). Acridine Yellow (CI 50040) whose λ max is 442 and Acridine Orange (CI46005) whose λ max is 489 nm. Other useful dyes are azo dyes for example tartrazine.

All these dyes are readily water soluble and can be introduced into the holographic material in a developing bath or by treating the holographic material with an aqueous bath which comprises the dye dissolved therein after completion of the developing.

A suitable concentration of the dye in a developing bath or aqueous bath to impart sufficient dye to the gelatinous layer is from 0.01 to 1.0 g/liter.

As the processing of both dichromated gelatin holograms and holographic material which comprises a photopolymerisation mixture includes an aqueous processing step wherein part of the binder is removed followed by a solvent treatment step preferably the dye is added to the aqueous treatment bath or to an aqueous bath after the aqueous treatment both but before the solvent treatment.

Preferably in the holographic material the hydrophilic water-swellable binder layer is gelatin. or is a binder which comprises at least 25% by weight of gelatin. Other useful binders which may be used alone or preferably in admixture with gelatin include albumin, casein, cellulose derivatives such as hydroxyethyl cellulose and carboxymethyl cellulose, polyvinyl alcohol, polyvinyl pyrrolidone and polyacrylamide.

A suitable photopolymerisation mixture comprises in the hydrophilic water-swellable binder an ethylenically unsaturated monomer, a dye capable of initiating free radical polymerisation on exposure to light in the presence of an initiator.

The suitable ethylenically unsaturated monomers for use in the present invention are the metal salts of acrylic or methacrylic acids. The preferred salts are lithium, sodium, potassium, barium, lead, zinc or magnesium acrylate. The most preferred salts are lithium or zinc acrylate.

Mixtures of the metal acrylates may be used or mixtures of metal acrylate and another ethylenically unsaturated monomer such as acrylamide, methacrylamide, N-hydroxymethylacrylamide, methylene bisacrylamide. Also esters of acrylic and methacrylic acids having low volatility may also be used, for example pentaerythritol tetraacrylate, trimethylolpropane trimethacrylate and polybutanediol diacrylate.

Suitable dyes for initiating free radical polymerisation include riboflavin. Rose Bengal, erythosin and eosin.

Suitable polymerisation initiating compounds include methanolamine, ketones such as benzophenone, peroxides such as benzoyl peroxide, sulphur compounds such as diphenyl sulphide and azo compounds such as azoxystyrene.

U.S. Pat. No. 4,173,474 describes a method for forming a hologram using a photopolymerisation mixture. Another such system is described in WO 85/01127 but the branched polyethyleneimine serves both as the polymerisation initiator and as the hydrophilic water-swellable binder.

When the holographic material from which the hologram is prepared is silver halide sensitised preferably the silver halide is predominantly silver bromide having a crystal size range of from 5 nm to 50 nm.

The supporting base may be any transparent base used in the photographic industry for example glass, biaxially oriented polyethylene terephthalate or polycarbonate or a cellulose derivative such as cellulose triacetate.

The hydrophilic water-swellable layer may have been coated on the base by any of the conventional techniques well known the to the photographic industry such as by use of a doctor bar, or by slot, cascade curtain or dip methods. The coated layer may then be dried by normal hot air methods. When the material is a dichromated gelatin hologram (D.C.G. hologram) the coated gelatin layer is sensitised with a dichromate solution just before it is holographically exposed.

The holographic exposure method used to produce the hologram may be any of the well known methods used to produce either a transmission or preferably reflection hologram using a laser source. A particularly suitable exposure method is the Denisyuk method for producing a reflection hologram. Any suitable layer source can be used but of particular utility to produce display holograms are He:Ne lasers, pulsed ruby lasers and argon-ion lasers.

The following Example will serve to illustrate the invention

EXAMPLE

Samples of holographic material were prepared by coating onto a transparent photographic film base a gelatino silver halide emulsion which was substantially pure silver bromide having a mean crystal size of 0.03 $\mu$m at a silver coating weight of 30 mg/dm$^2$. The emulsion was optically sensitised with a red sensitising dye so that it was optimally sensitive to 633 n.m. the colour of a He:Ne laser.

The material was holographically exposed by a Denisyuk exposure method using a brushed aluminium plate as an object to yield (after processing) a reflective hologram.

The material was then developed for 2 minutes in a solution of the following formulation:

| | |
|---|---|
| Sodium Sulphite Anhydrous | 30 g |
| Hydroquinone | 10 g |
| Sodium Carbonate | 60 g |
| Water to | 1000 ml |

Some of the samples were then transferred to a rehalogenating bleach bath of the following composition:

| | |
|---|---|
| Fe(NH$_4$)EDTA(1.8 m Solution) | 150 mls |
| KBr | 10 g |
| pH | 5.5 |
| Water to | 1000 mls | until all the silver metal had been bleached out which was about 2 minutes.

The peak replay wavelength of the processed material was then measured and found to be 580 nm.

Other strips of the developed samples were transferred to rehalogenating bleach baths of the following compositions:
A1: as before +0.1 g Neutral Red
B1: as before +0.1 g Acridine Yellow
C1: as before +0.1 g Acridine Orange
D1: as before +0.1 g Cresyl Violet
E1: as before +0.1 g Nile Blue
Other strips of the developed and bleached strips were transferred to aqueous baths of the following compositions for two minutes:

A2: 0.1 g Neutral Red per 1 liter water
B2: 0.1 g Acridine Yellow per 1 liter water
C2: 0.1 g Acridine Orange per 1 liter water
D2: 0.1 g Cresyl Violet per 1 liter water
E2: 0.1 g Nile Blue per 1 liter water The peak absorption wavelength of these dyes is as follows:
Neutral Red 540 nm
Acridine Yellow 442 nm
Acridine Orange 489 nm
Cresyl Violet 596 nm
Nile Blue 633 nm The peak replay wavelength of the material processed in the absence of the dye was 580 nm.

All the samples containing dyes were then compared with the sample which contained no dye with respect to the brightness of the hologram and the haze or light scatter.

The brightness is shown as % diffraction efficiency and the scatter as a % as well.

| SAMPLE | DIFFRACTION EFFICIENCY | SCATTER |
|---|---|---|
| Control | 24% | 10.5% |
| A1 and A2 | 35% | 6.8% |
| B1 and B2 | 38% | 4.0% |
| C1 and C2 | 36% | 4.2% |
| D1 and D2 | 23% | 10.5% |
| E1 and E2 | 24% | 12.0% |

The higher the diffraction efficiency % the brighter the hologram whilst the smaller the scatter % the less haze there was present in the hologram.

Thus the holograms A1, A2, B1, B2, C1 and C2 of the present invention i.e. those which comprised Neutral Red, Acridine Yellow or Acridine Orange all of whose peak absorptions are below the peak replay wavelength of the control hologram which was 580 nm exhibit both increased brightness and less haze compared with the control.

On the other hand the holograms D1, D2, E1 and E2 outside the present invention i.e. those which comprised either Cresyl Violet or Nile Blue both of whose peak absorptions are above that of the control hologram exhibit no improvement either in brightness or in haze reduction.

We claim:

1. A process for the production of a hologram which comprises holographically exposing holographic material which comprises a light transparent base having coated thereon light-sensitive silver halide in a hydrophilic water swellable layer in which a holographic image can be formed, processing this layer to form a holographic image which process is characteriaed in that the material is treated during developing with an aqueous bath which comprises a water-soluble dye whose peak absorption is below the peak replay wavelength of the hologram.

2. A process for the production of a hologram which comprises holographically exposing holographic material which comprises a light transparent base having coated thereon light-sensitive silver halide in a hydrophilic water swellable layer in which a holographic image can be formed, processing this layer to form a holographic image which process is characterized in that the material is treated after developing with an aqueous bath which comprises a water-soluble dye whose peak absorption is below the peak replay wavelength of the hologram.

* * * * *